United States Patent [19]

Lipschutz

[11] Patent Number: 4,747,533
[45] Date of Patent: May 31, 1988

[54] BONDING METHOD AND APPARATUS

[75] Inventor: Lewis D. Lipschutz, Poughkeepsie, N.Y.

[73] Assignee: International Business Machines Corporation, Armonk, N.Y.

[21] Appl. No.: 856,516

[22] Filed: Apr. 28, 1986

[51] Int. Cl.$^4$ .............................................. B23K 3/00
[52] U.S. Cl. .................... 228/180.1; 228/37; 228/264
[58] Field of Search ............... 228/37, 39, 180.1, 219, 228/220, 240, 242, 264

[56] References Cited

U.S. PATENT DOCUMENTS

| Re. 30,399 | 9/1980 | Ammann et al. | 228/180.1 |
| 3,054,174 | 9/1962 | Rose et al. | 228/180.1 |
| 4,055,217 | 10/1977 | Chu et al. | 228/180.1 |
| 4,077,467 | 3/1978 | Spigarelli | 228/180.1 |
| 4,334,646 | 6/1982 | Campbell | 228/180.2 |
| 4,412,641 | 11/1983 | Fuchs et al. | 228/37 |
| 4,441,647 | 4/1984 | Holmes | 228/264 |
| 4,474,322 | 10/1984 | Aldous | 228/180.1 |
| 4,538,757 | 9/1985 | Bertiger | 228/180.1 |
| 4,549,686 | 10/1985 | Sargent et al. | 228/180.1 |
| 4,561,584 | 12/1985 | Hug | 228/264 |
| 4,561,586 | 12/1985 | Abel et al. | 228/119 |
| 4,580,716 | 4/1986 | Barresi et al. | 228/180.1 |
| 4,612,712 | 9/1986 | Pescatore et al. | 228/180.1 |

OTHER PUBLICATIONS

Apparatus for Small Vertical Movement, by Hamilton and Karcher, vol. 11 No. 10, p. 1334 Mar. 1969, IBM Bulletin.
Nozzle for Flow Soldering Machines, by Pringel, vol. 2, No. 2, p. 25, Aug. 1959, IBM Bulletin.
Rework Apparatus for Multipin Array Modules, by Steenstrup, vol. 17, No. 1, p. 56, Jun. 1974, IBM Bulletin.
Solder Wave Stocking, by Petri, vol. 14 No. 10 p. 2887, Mar. 1972, IBM Bulletin.
Method for Rosin-Oil Soldering by Babuka and Poliak, vol. 12, No. 8, p. 1209, Jan. 1970, IBM Bulletin.
Oxidation Prevention, by Mele, vol. 11, No. 12, May 1969, p. 1687, IBM Bulletin.

*Primary Examiner*—M. Jordan
*Attorney, Agent, or Firm*—Wolmar J. Stoffel; Ira David Blecker

[57] ABSTRACT

An apparatus for reflowing solder terminals that join an electronic element to a support substrate, which apparatus includes (1) a stage for supporting the substrate, (2) a quantity of liquid capable of being heated to a temperature in excess of the melting point of the solder of the solder terminals, (3) a means to contact a surface of the substrate with the liquid, including a reservoir for maintaining the liquid, and a pumping means to move the liquid from the reservoir into contact with the surface of the substrate, and (4) a means to control the temperature of the liquid when in contact with the substrate to initially increase the temperature of the liquid, and subsequently reduce the temperature of the liquid.

19 Claims, 4 Drawing Sheets

BONDING METHOD AND APPARATUS

BACKGROUND OF THE INVENTION

The present invention relates generally to solder reflow assembly techniques and apparatus therefor, more particularly to an apparatus and method for forming solder terminals between a substrate and a device, and rework processes.

A very common technique for joining an electronic element and a supporting substrate is forming solder connections between same. Patents which describes such solder connections and a method of forming these connections are U.S. Pat. Nos. 3,429,040 and 3,495,133. In general solder wettable pads are surrounded by non-solder wettable material, i.e., glass or quartz are provided on the device and also on the substrate. Solder is evaporated through a mask on either the device or substrate and heated to the melting point of the solder which causes it to ball up over the pads into mounds. After the solder balls have solidified, the device is positioned over the substrate with the respective solder pads in alignment, and the assembly heated to again melt or reflow the solder. When the solder balls are remelted and allowed to solidify solder connections are established between the solder wettable pads of the device and substrate. The surface tension of the molten solder will shift the device to correct for minor misalignments. If a device or a connection is defective, the device can be removed and replaced by remelting the solder connections, lifting off the device, and replacing it. When the substrate contains numerous devices, multiple device rework operations may be necessary before all the connections are perfect or to replace devices that fail in use.

It has been noted that repeated remelting of the solder, and exposure to high temperatures, particularly above 300° C. for extended time, as well as a slow rate of cooling from these temperatures causes the formation of intermetallics in solder connections which have a degrading influence. Intermetallics are compounds or alloys of the molecules of the solder and possibly the metals in the pad that have been placed in intimate contact during a process of brazing or soldering. In addition, exposure of the solder terminals to high temperatures causes grain growth within the terminals. Both intermetallics and grain growth degrade the solder connection by making it more brittle and less resistant to stress and strain. Strain is imposed on the solder connections by thermal cycling which normally occurs during use, particularly when the coefficients of expansion of the materials of the device and substrate are different.

It is conventional to reflow the solder mounds to form a connection by placing the substrate with devices in place on a belt furnace and passing the assembly through the heated environment. The same basic process is used for other solder connections such as I/O pins to a substrate. This exposes the substrate, the device, and the solder bonds to a prolonged heating period, typically on the order of 20 minutes or longer. As the mass of the substrate increased, the non-uniformity of temperature in the substrate increased, the time at elevated temperature increased and the cooling rate decreased. Still further, as the substrate area increases, the number of devices on the substrate increase thereby increasing the probability of more rework operations, each of which requires a device separation and a solder reflow joining operation. Still further, the prolonged heating may damage the devices by degrading the metallurgy and spreading the diffused impurities thus moving the PN junctions and expanding the device impurity regions.

SUMMARY OF THE INVENTION

An object of this invention is to provide a new apparatus for reflowing solder connections which materially shortens the time period that the device, the substrate, and the solder connections are exposed to elevated temperatures.

Another object is to provide more uniform heating of the substrate area.

Another object of this invention is to provide a new method for reflowing solder connections which materially shortens the time period that the device, the substrate, and the solder connections are exposed to elevated temperatures.

Yet another object of this invention is to provide an apparatus and a method that will perform solder reflow operations and eliminate or minimize device and solder bond degradation.

These and other objects of the invention are accomplished by an apparatus for reflowing solder terminals that join an electronic element to a support substrate which includes a stage for supporting the substrate, a quantity of fluid capable of being heated to a temperature in excess of the melting point of the solder of the solder terminals, a means to contact a surface of the substrate with the fluid, the means including at least one reservoir for maintaining fluid at a temperature in excess of the melting point of the solder, and a pumping means to move the fluid from reservoir into contact with a surface of the substrate.

Other objects, advantages and novel features of the present invention will become apparent from the following detailed description of the invention when considered in conjunction with the accompanying drawings.

DESCRIPTION OF THE PREFERRED EMBODIMENTS

Figure 1:
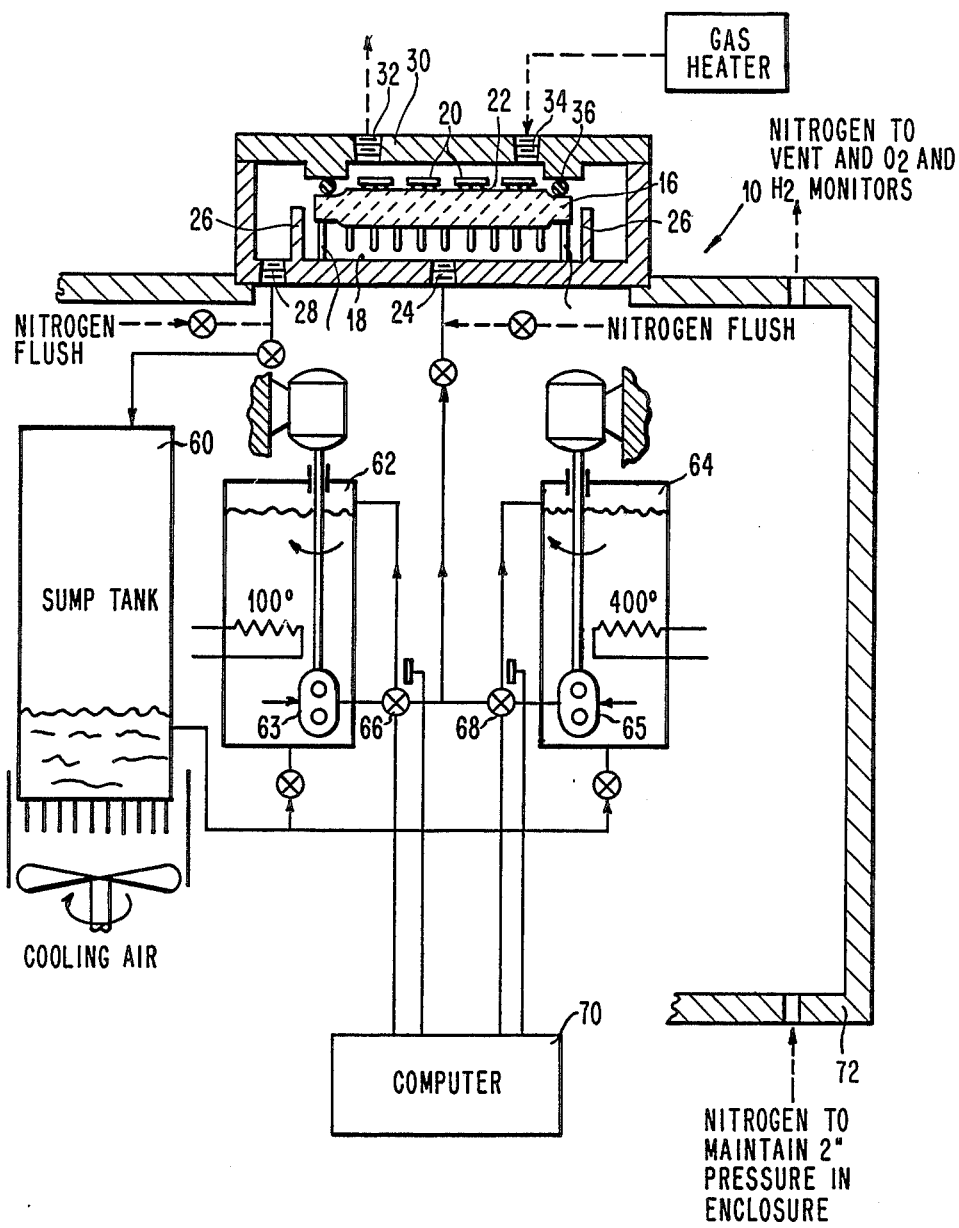
FIG. 1 is a front elevational view, in cross section, of the apparatus of the invention with various elements and their relationship illustrated schematically.
Figure 2:
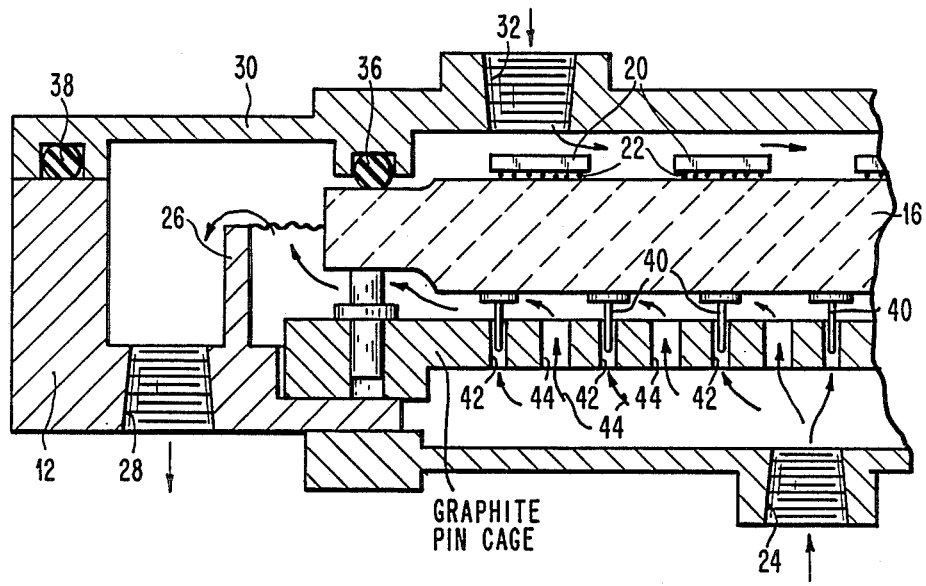
FIG. 2 is a front elevational view in an enlarged scale and broken section of the heating chamber of the apparatus of the invention.

Referring now to FIGS. 1 and 2 there is illustrated a preferred specific embodiment of the invention. The apparatus 10 for reflowing solder bonds, either to form the solder bonds or to melt bonds that have already been formed so that the substrate and device can be separated, has a container 12 having a stage 14 that supports substrate 16 above the floor 18 of container 12. The stage 14 can be pegs, fins, or any other suitable structure that engages the bottom surface of substrate 12 and maintains it at a predetermined height in the container. Devices 20 are shown positioned on and joined to substrate 16 with solder connections 22. In operation, fluid is pumped into container 12 through opening 24 to contact the bottom surface of substrate 16 to either heat or cool the substrate. The level of fluid is controlled by wier 26 as more clearly illustrated in FIG. 2. The fluid upon overflowing the wier exits the container through opening 28. A cover 30 can be provided for container 12 to provide an inert gas atmosphere which can also be heated, for heating the devices 20 on substrate 16. The cover 30 has openings 32 and 34 for introducing and removing inert or heated gas to container 12. Any desirable gas can be introduced and exhausted through openings 32 and 34, including forming gas, hydrogen gas or inert gases for flux free joining. The various gases can be either heated, cooled, or at room temperature. A seal 36 positioned between the cover 30 and the top surface of substrate 16 confines the chosen environment to the surface area of the substrate and also keeps fluid and fluid vapor from contacting the top surface. As shown in more detail in FIG. 2 another seal element 38 can be provided between the outer perimeter of cover 30 and container 12. The embodiment in FIG. 2 also includes an arrangement that provides support for pins 40 during the reflow heating cycle, when the pins are soldered or brazed on the substrate 16. In use the solder may soften during the heat cycle and stretch the solder securing them to the substrate. An apertured plate, preferably of graphite, is supported in container 12. Openings 42 have a diameter greater than the diameter of pins 40. As fluid is pumped into container 12 through opening 24 a portion of the fluid passes between the pins 40 and the walls of openings 42. The fluid applies hydraulic pressure against the pins and has a frictional drag on the pins surface which exerts upward forces that aid in supporting the pins. Additional openings 44 can be provided to permit a greater rate of fluid flow. The pattern of the openings can be varied to achieve uniform heating of the substrate e.g., if corners lag then fewer holes are provided at the center of the substrate and more at the corners.

Any suitable fluid can be used in the practice of my invention. Typically the fluid will be a liquid, such as oil or the like. The fluid must have a boiling point above the melting point of the solder material being reflowed and a relatively low vapor pressure as well as being non-explosive and non-toxic. The fluid should be sufficiently inert so that the surface of the substrate that it contacts is not degraded nor otherwise adversely affected. I have discovered that a suitable fluid is polyphenyl ether.

Figure 4:
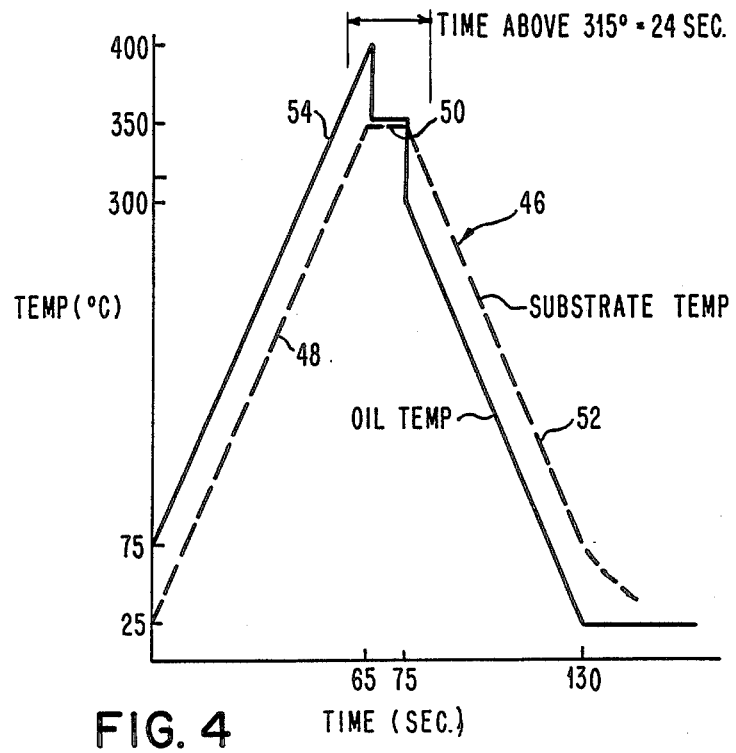
FIG. 4 is a heating profile of temperature versus time that depicts typical heating cycle used by the apparatus and process of the invention.
Figure 5:
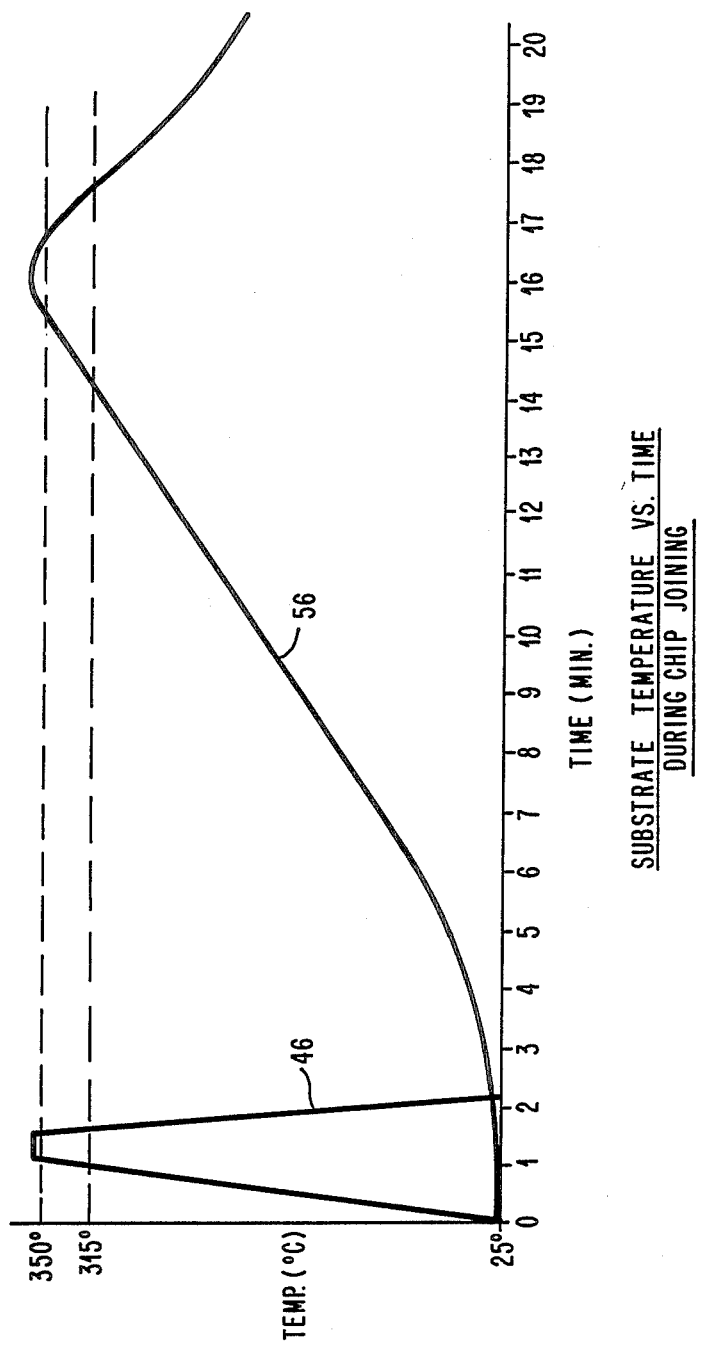
FIG. 5 is another heating profile of temperature versus time that provides a comparison of the heat cycle associated with this invention, and a typical heat cycle associated with a belt furnace performing a similar reflow operation.

Referring now to FIG. 4 there is depicted by dashed lines a substrate temperature profile 46 consisting of a heat phase 48 where the substrate temperature increases at a rapid rate, a hold phase 50 where the substrate temperature is constant for a short time, and finally a cooling phase 52 where the substrate temperature is decreased rapidly. In order to achieve this substrate temperature profile, the fluid temperature profile 54 is maintained in container 12 by a mechanism to be described. Since there is a time lag between the substrate temperature and the fluid temperature. The profile 54 depicting fluid temperature therefore is several degrees higher than the substrate temperature as depicted by profile 46. Heating or cooling the substrate with liquid is much faster and more efficient than cooling with air or gas as a heating medium, or radiant heat. FIG. 5 provides a vivid comparison between a substrate profile 46 using a liquid as a heating and cooling medium, and profile 56 using heated air or inert gas in a belt furnace, for similar ceramic substrates. Experimental measurements on 90 mm square substrates have shown heat transfer efficiency in oil heating to be 40 times that in the hottest zone of a belt furnace.

Referring now to FIG. 1 of the drawings sump tank 60 is shown receiving the fluid from container 12 that has overflowed wier 26 after coming in contact with substrate 16. The fluid is cooled and subsequently returned to holding tanks 62 and 64 where the temperature of the fluid is maintained, or the fluid heated. The fluid is stored at either a relatively low temperature for cooling purposes or a high temperature for heating purposes. Pumps 63 and 65 are provided in tanks 62 and 64, respectively, to supply the fluids, properly blended, to achieve the proper temperature to container 12. Valves 66 and 68 that control the flow of fluid from pumps 63 and 65 shift the flow from circulation within the tank to ensure uniformity of temperature throughout the tank to delivery to the processing containers. The computer controls the speed of the two pumps. Computer 70 is programmed to provide the proper blend of hot and cool liquids at the proper time to achieve an oil temperature profile, such as depicted in FIG. 4. Preferably the plumbing and the tanks are enclosed in a chamber 72 and a nitrogen environment maintained therein for safety.

Figure 3:
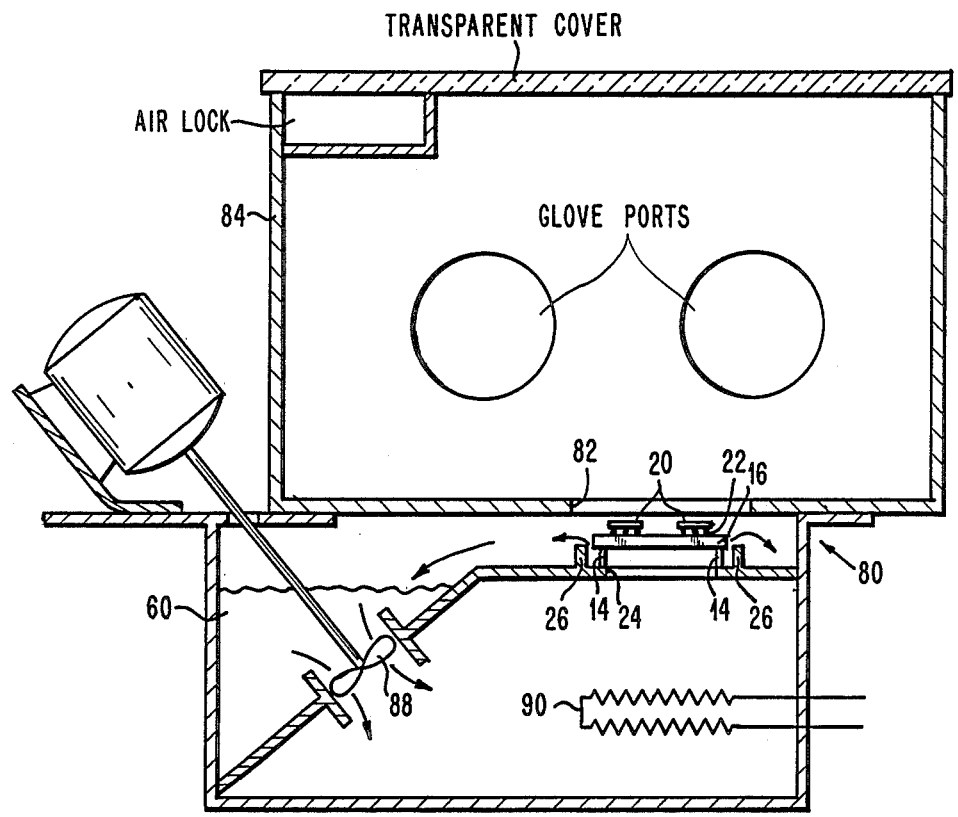
FIG. 3 is a front elevational view, in cross section, illustrating another embodiment of the apparatus of the invention.

In FIG. 3 there is depicted another preferred specific embodiment of the apparatus 80 of my invention. Apparatus 80 does not have the capability of providing a closely controlled heating profile possible with apparatus 10. However the apparatus is useful for removing devices 20 from substrates 16 for rework or for joining devices by manually placing and removing substrates on stage 14. The substrate 16 is accessible through opening 82 in glove box 84. Normally an inert gas environment is provided in glove box 84. Fluid is forced from the sump 60 into chamber 86 by pump 88. The fluid is forced upwardly through opening 24 into contact with the substrates 16. The fluid after overflowing wier 26 flows back to sump 60 and the process is repeated. A heating element 90 provides control of the fluid temperature.

FIG. 5 of the drawing illustrates a heating profile 46 of the temperature on the top of ceramic substrate vs. time obtained by using the apparatus and process of this invention using a heated liquid, and subsequently a cooling liquid applied to the bottom surface of the substrate. By way of comparison profile 56 vs. a plate of temperature on the top of the same ceramic substrate vs. time obtained with a belt furnace. These profiles dramatically illustrate the differences that the time a substrate is exposed to elevated temperatures.

The apparatus and method of the invention is particularly suited for solder bonding integrated circuit semiconductor devices to a ceramic substrate. However, the invention can be used for any application where it is advantageous to solder, braze, or otherwise bond elements to a workpiece without exposing the elements and/or the bond to elevated temperatures for lengthy periods of time or otherwise control the temperature for any reason. In particular, the invention is useful for bonding I/O pins, capacitors, attachment chips and the like to substrates of any material, and to remove and rebond elements where the assembly must be re-worked to correct for defects and the like. In the preferred embodiment, the environment on a surface of the substrate can be controlled to protect the elements to be bonded, or achieve conditions that are conducive to bonding integrity.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. An apparatus for reflowing solder terminals that join an electronic element to a support substrate comprising,
   a stage for supporting said subtrate,
   a quantity of liquid capable of being heated to a temperature in excess of the melting point of the solder of said solder terminals,
   a means to contact a surface of said substrate with said liquid said means including at least one reservoir and a pumping means to move said liquid from said reservoir into contact with a surface, and a means to control the temperature of said liquid when in contact with said substrate to initially increase the temperature of the liquid, and subsequently to reduce the temperature of said liquid, wherein the temperature of said liquid in contact with said substrate is varied according to said control means.

2. The apparatus of claim 1 where said electronic element is mounted on the top surface of said substrate, and said means to contact the substrate with liquid contacts the bottom surface of said substrate with heated liquid.

3. An apparatus for reflowing solder terminals that join an electronic element to a support substrate comprising,
   a stage for supporting said substrate,
   a quantity of fluid capable of being heated to a temperature in excess of the melting point of the solder of said solder terminals,
   a means to contact a surface of said substrate with said fluid, said means including at least one reservoir and a pumping means to move said fluid from said reservoir into contact with a surface, and a means to control the temperature of said fluid when in contact with said substrate to initially increase the temperature of the fluid, and subsequently to reduce the temperature of said fluid,
   wherein said means to control the temperature of fluid includes at least two fluid reservoirs that hold fluid at different temperatures, a mixing valve, a fluid pump associated with each fluid reservoir, and a control means to control said fluid pumps and mixing valve to supply heated fluid at varying temperatures to contact said substrate.

4. The apparatus of claim 3 wherein said electronic device is an integrated semiconductor device having a plurality of solder terminals to be joined to corresponding solder pads on the top surface of said substrate.

5. The apparatus of claim 4 wherein said substrate is a multilayer ceramic substrate provided with I/O pins on the bottom surface.

6. The apparatus of claim 4 wherein said means to contact the substrate with fluid further includes a container to receive and support said substrate therein at a predetermined height, and a wier to maintain the level of fluid in the container at a height to maintain contact of fluid with the bottom surface of said substrate.

7. The apparatus of claim 1 wherein said means to contact the substrate with liquid further includes a container to receive and support said substrate therein at a predetermined height, and a wier to maintain the level of liquid in the container at a height to maintain contact of liquid with the bottom surface of said substrate.

8. The apparatus of claim 7 which further includes a plate provided with apertures for receiving said I/O pins, said apertures of a size to provide clearance about said pins to allow liquid flow between the aperture wall and pin.

9. An apparatus for reflowing solder terminals that join an electronic element to a support substrate comprising,
   a stage for supporting said substrate,
   a quantity of fluid capable of being heated to a temperature in excess of the melting point of the solder of said solder terminals,
   a means to contact a surface of said substrate with said fluid, said means including at least one reservoir and a pumping means to move said fluid from said reservoir into contact with a surface, and a means to control the temperature of said fluid when in contact with said substrate to initially increase the temperature of the fluid, and subsequently to reduce the temperature of said fluid,
   wherein said means to contact the substrate with fluid further includes a container to receive and support said substrate therein at a predetermined height, and a wier to maintain the level of fluid in the container at a height to maintain contact of fluid with the bottom surface of said substrate, and
   wherein said container includes a cover element, a seal element positioned between said cover element and a substrate supported in said container to thereby form a sealed enclosure over the top surface of said device mounted on the top surface.

10. The apparatus of claim 9 wherein a means is provided to introduce and circulate an inert or reducing gas into and through said sealed enclosure.

11. The apparatus of 3 wherein a first fluid reservoir contains heated fluid, and a second fluid reservoir contains cool fluid, said control means acting to mix fluids from said first reservoir and said second reservoir to increase the temperature of said fluid contacting said substrate to above the melting point of said solder, and subsequently reduce the temperature of fluid contacting said substrate, and a sump tank for accepting the fluid after it has contacted said substrate.

12. The apparatus of claim 11 wherein conduit means is provided to return fluid from said sump tank to said first fluid reservoir and said second fluid reservoir.

13. The apparatus of claim 12 wherein a heating means is provided in each of said first and said second fluid reservoirs.

14. The apparatus of claim 13 wherein said fluid is polyphenyl ether.

15. The apparatus of claim 10 wherein a means is provided to heat said gas introduced to said sealed enclosure.

16. The apparatus of claim 8 wherein additional apertures are provided in said plate to direct additional liquid against said substrate to assist in achieving a more uniform top surface temperature on said substrate.

17. An apparatus for reflowing solder terminals that join an electronic element to a support substrate comprising,
  a stage for supporting said substrate,
  a quantity of fluid capable of being heated to a temperature in excess of the melting point of the solder of said solder terminals,
  a means to contact a surface of said substrate with said liquid, said means including at least one reservoir for maintaining liquid at a temperature in excess of said melting point of said solder, and a pumping means to move said fluid from said reservoir into contact with a surface of said substrate,
  an opening on the top of said reservoir,
  a support for holding said substrate over said opening,
  a wier for maintaining a fluid level above the bottom surface of said substrate when positioned on said support, and a sump for collecting liquid overflowing said wier,
  a glove box mounted over said substrate, and
  a means to maintain an inert gas environment in said glove box.

18. The apparatus of claim 17, wherein said pump means moves fluid from said sump into said fluid reservoir.

19. The apparatus of claim 18 wherein said fluid is polyphenyl ether.

* * * * *